United States Patent
Ramaswamy (10) Patent No.: US 11,778,838 B2
(45) Date of Patent: *Oct. 3, 2023

(54) MEMORY ARRAYS COMPRISING VERTICALLY-ALTERNATING TIERS OF INSULATIVE MATERIAL AND MEMORY CELLS AND METHODS OF FORMING A MEMORY ARRAY

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/867,544

(22) Filed: Jul. 18, 2022

(65) Prior Publication Data

US 2022/0352167 A1 Nov. 3, 2022

Related U.S. Application Data

(60) Continuation of application No. 17/001,906, filed on Aug. 25, 2020, now Pat. No. 11,411,002, which is a
(Continued)

(51) Int. Cl.
*H01L 27/105* (2023.01)
*H01L 27/11514* (2017.01)
(Continued)

(52) U.S. Cl.
CPC ............ *H10B 99/00* (2023.02); *G11C 11/221* (2013.01); *G11C 11/223* (2013.01); *G11C 11/24* (2013.01);
(Continued)

(58) Field of Classification Search
CPC ........ H10B 99/00; H10B 12/02; H10B 12/03; H10B 12/033; H10B 12/0335;
(Continued)

(56) References Cited

U.S. PATENT DOCUMENTS

| 6,974,994 B1 | 12/2005 | Kuo et al. |
| 7,666,737 B2 | 2/2010 | Tu |

(Continued)

FOREIGN PATENT DOCUMENTS

| CN | 201880057380.9 | 2/2013 |
| CN | 103038881 | 4/2013 |

(Continued)

*Primary Examiner* — Natalia A Gondarenko
(74) *Attorney, Agent, or Firm* — Wells St. John P.S.

(57) ABSTRACT

A memory array comprises vertically-alternating tiers of insulative material and memory cells. The memory cells individually comprise a transistor and a capacitor. The capacitor comprises a first electrode electrically coupled to a source/drain region of the transistor. The first electrode comprises an annulus in a straight-line horizontal cross-section and a capacitor insulator radially inward of the first electrode annulus. A second electrode is radially inward of the capacitor insulator. A capacitor-electrode structure extends elevationally through the vertically-alternating tiers. Individual of the second electrodes of individual of the capacitors are electrically coupled to the elevationally-extending capacitor-electrode structure. A sense line is electrically coupled to another source/drain region of multiple of the transistors that are in different memory-cell tiers. Additional embodiments and aspects are disclosed, including methods.

18 Claims, 10 Drawing Sheets

Related U.S. Application Data division of application No. 16/119,835, filed on Aug. 31, 2018, now Pat. No. 10,804,273.

(60) Provisional application No. 62/554,972, filed on Sep. 6, 2017.

(51) Int. Cl.

| | |
|---|---|
| *H01L 27/11597* | (2017.01) |
| *H01L 27/108* | (2006.01) |
| *G11C 11/22* | (2006.01) |
| *G11C 11/24* | (2006.01) |
| *H10B 99/00* | (2023.01) |
| *H01L 27/06* | (2006.01) |
| *H10B 12/00* | (2023.01) |
| *G11C 5/02* | (2006.01) |
| *H10B 51/20* | (2023.01) |
| *H10B 53/20* | (2023.01) |

(52) U.S. Cl.
CPC ......... *H01L 27/0688* (2013.01); *H10B 12/30* (2023.02); *H10B 12/37* (2023.02); *G11C 5/02* (2013.01); *H10B 51/20* (2023.02); *H10B 53/20* (2023.02)

(58) Field of Classification Search
CPC ...... H10B 12/05; H10B 12/31; H10B 12/312; H10B 12/318; H10B 12/373; H10B 12/377; H10B 12/482; H10B 12/30; H10B 12/37; H10B 51/10; H10B 51/20; H10B 51/30; H10B 53/10; H10B 53/20; H10B 53/30; H10B 41/10; H10B 41/20; H10B 41/27; H10B 41/30; H10B 41/60; H10B 43/10; H01L 27/1052; H01L 27/0629; H01L 27/0688; H01L 27/10805; H01L 27/108; H01L 27/10811; H01L 27/10817; H01L 27/10829; H01L 27/10832; H01L 27/1207; H01L 2027/1185; H01L 2027/11862; H01L 2027/11879; H01L 2027/11883; H01L 2027/11881; H01L 29/0657; H01L 29/1025; H01L 29/1029; H01L 29/1033; H01L 29/1075; H01L 29/1079; H01L 29/16; H01L 29/24; H01L 29/42312; H01L 29/4232; H01L 29/78; H01L 29/7869; H01L 25/043; H01L 25/0657; H01L 25/0756; H01L 23/5223; H01L 23/5226; H01L 28/40; H01L 27/0727; H01L 27/0207; H01L 27/11597; H01L 27/11514; H01L 27/11551; H01L 27/11553; H01L 27/11565; H01L 27/11568; H01L 27/11578; H01L 27/11587; G11C 11/223; G11C 11/221; G11C 11/24; G11C 5/02
USPC ........ 257/295, 208, 379; 365/145, 149, 194, 365/205
See application file for complete search history.

(56) References Cited

U.S. PATENT DOCUMENTS

| | | | |
|---|---|---|---|
| 8,158,967 | B2 | 4/2012 | Tang et al. |
| 8,791,447 | B2 | 7/2014 | Liu et al. |
| 9,698,272 | B1 | 7/2017 | Ikeda et al. |
| 9,754,946 | B1 | 9/2017 | Yang et al. |
| 10,607,995 | B2 | 3/2020 | Roberts et al. |
| 2002/0064065 | A1 | 5/2002 | Salling |
| 2003/0185048 | A1* | 10/2003 | Fricke ................. H01L 21/8221 365/170 |
| 2004/0166646 | A1 | 8/2004 | Sandhu et al. |
| 2007/0236979 | A1* | 10/2007 | Takashima ............ H01L 27/105 257/E21.664 |
| 2011/0084314 | A1 | 4/2011 | Or-Bach et al. |
| 2011/0147823 | A1 | 6/2011 | Kuk et al. |
| 2012/0153371 | A1 | 6/2012 | Chen et al. |
| 2012/0155145 | A1 | 6/2012 | Kim |
| 2012/0211834 | A1 | 8/2012 | Yang et al. |
| 2013/0153851 | A1 | 6/2013 | Park |
| 2013/0295726 | A1 | 11/2013 | Tang et al. |
| 2013/0323902 | A1 | 12/2013 | Lee et al. |
| 2015/0255490 | A1 | 9/2015 | Miyairi |
| 2015/0270288 | A1 | 9/2015 | Yamazaki et al. |
| 2015/0318296 | A1 | 11/2015 | Kim et al. |
| 2016/0351572 | A1* | 12/2016 | Atsumi ............... G11C 11/4096 |
| 2017/0098596 | A1 | 4/2017 | Lin et al. |
| 2017/0154952 | A1 | 6/2017 | Komeda |
| 2018/0175044 | A1 | 6/2018 | Rhie |
| 2019/0006376 | A1 | 1/2019 | Ramaswamy |

FOREIGN PATENT DOCUMENTS

| | | |
|---|---|---|
| EP | 18854433 | 8/2020 |
| JP | H03-205867 | 9/1991 |
| KR | 10-2012-0083469 | 7/2012 |
| WO | WO 2011/062714 | 5/2011 |
| WO | WO PCT/US2018/049215 | 1/2019 |
| WO | WO PCT/US2018/049215 | 3/2020 |

* cited by examiner

MEMORY ARRAYS COMPRISING VERTICALLY-ALTERNATING TIERS OF INSULATIVE MATERIAL AND MEMORY CELLS AND METHODS OF FORMING A MEMORY ARRAY

RELATED PATENT DATA

This patent resulted from a continuation of U.S. patent application Ser. No. 17/001,906 filed Aug. 25, 2020, which is a divisional of U.S. patent application Ser. No. 16/119,835 filed Aug. 31, 2018, which claims priority to and the benefit of U.S. Provisional Application Ser. No. 62/554,972 filed Sep. 6, 2017, each of which is hereby incorporated by reference herein.

TECHNICAL FIELD

Embodiments disclosed herein pertain to memory arrays comprising vertically-alternating tiers of insulative material and memory cells and to methods of forming a memory array.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Programmable materials other than ferroelectric materials may be used as a capacitor insulator to render capacitors non-volatile.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage/trap regions as part of the gate construction between the gate insulator and the conductive gate.

One type of transistor is a ferroelectric field effect transistor (FeFET) wherein at least some portion of the gate construction (e.g., the gate insulator) comprises ferroelectric material. The two different polarized states of the ferroelectric material in field effect transistors may be characterized by different threshold voltage ($V_t$) for the transistor or by different channel conductivity for a selected operating voltage. Again, polarization state of the ferroelectric material can be changed by application of suitable programming voltages, and which results in one of high channel conductance or low channel conductance. The high and low conductance, invoked by the ferroelectric polarization state, remains after removal of the gate programming voltage (at least for a time). The status of the channel can be read by applying a small drain voltage which does not disturb the ferroelectric polarization. Programmable materials other than ferroelectric materials may be used as a gate insulator to render a transistor to be non-volatile.

DETAILED DESCRIPTION OF EXAMPLE EMBODIMENTS

Embodiments of the invention encompass memory arrays and methods of forming memory arrays. A first example structure embodiment of an example memory array is shown in and described with reference to FIGS. 1-3. Such includes a substrate structure or construction 8 comprising a memory array 10 fabricated relative to a base substrate 11. Example base substrate 11 may comprise any one or more of conductive/conductor/conducting (i.e., electrically herein), semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
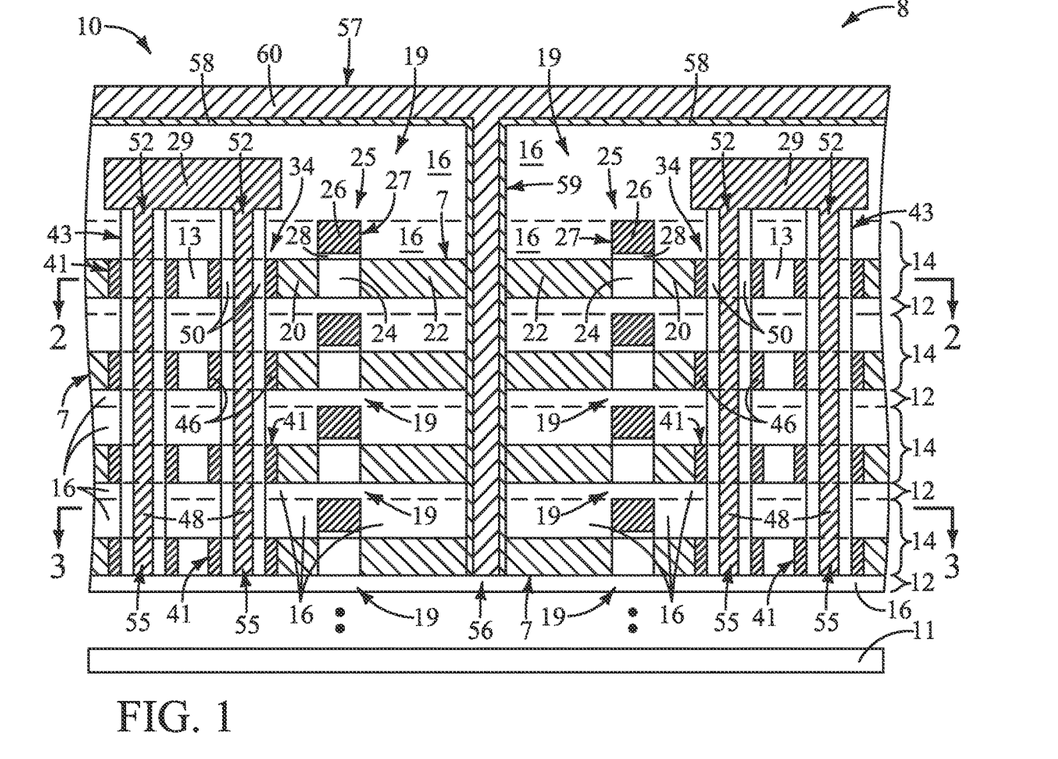
FIG. 1 is a diagrammatic sectional view of a substrate fragment comprising a memory array in accordance with an embodiment of the invention.
Figure 2:
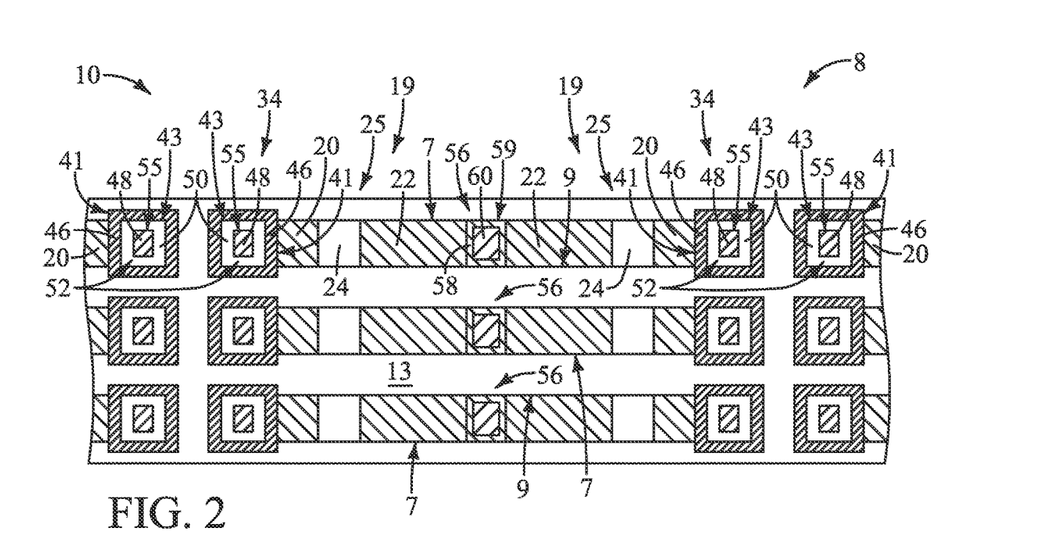
FIG. 2 is a sectional view taken through line 2-2 in FIG. 1.
Figure 3:
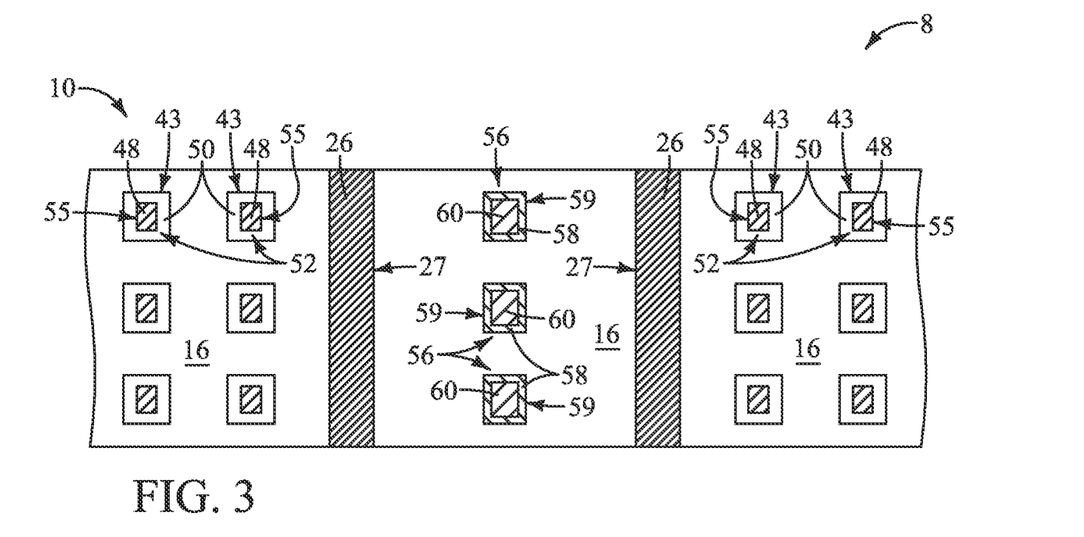
FIG. 3 is a sectional view taken through line 3-3 in FIG. 1.

Construction 8 includes vertically-alternating tiers 12 and 14 of insulative material 16 (e.g., comprising, consisting essentially of, or consisting of silicon nitride and/or doped or undoped silicon dioxide of a thickness of 200 Angstroms to 600 Angstroms) and memory cells 19, respectively. In some embodiments, tiers 14 may be considered as transistor tiers 14. Memory-cell tiers 14 may be of the same or different thickness as that of insulative material tiers 12, with different and greater thickness being shown (e.g., 500 Angstroms to 1,500 Angstroms). Construction 8 is shown as having eight vertically-alternating tiers 12 and 14, although fewer or likely many more (e.g., dozens, hundreds, etc.) may be formed. Accordingly, more tiers 12 and 14 may be below the depicted tiers and above base substrate 11 and/or more tiers 12 and 14 may be above the depicted tiers. Tiers 14 comprise horizontally-alternating lines 7 and 9 of active area (variously appropriately doped semiconductor material) and insulating material 13 (e.g., the other of silicon nitride or silicon dioxide where insulative material 16 is one of silicon nitride or silicon dioxide), respectively.

Memory cells 19 individually comprise a transistor 25 and a capacitor 34. Transistor 25 comprises a first source/drain region 20 and a second source/drain region 22 (e.g., conductively-doped semiconductor material such as polysilicon or semiconductively-doped semiconductor material such as polysilicon for each) having a channel region 24 therebetween (e.g., doped semiconductor material, such as polysilicon, but not to be intrinsically conductive). In some embodiments (but not shown), a conductively-doped semiconductor region and/or or another semiconductive region (e.g., LDD and/or halo regions) may be between channel region 24 and one or both of source/drain regions 20 and 22. In the example embodiment, individual active-area lines 7 comprise first source/drain region 20, second source/drain region 22, and channel region 24.

A gate 26 (e.g., one or more of elemental metal, a mixture or alloy of two or more elementals, conductive metal compounds, and conductively-doped semiconductive materials) is operatively proximate channel region 24. Specifically, in the depicted example, a gate insulator material 28 (e.g., silicon dioxide, silicon nitride, hafnium oxide, other high k insulator material, and/or ferroelectric material) is between gate 26 and channel region 24. Gate 26 as shown may comprise a portion of a horizontal longitudinally-elongated access line 27 that interconnects multiple of gates 26 along that access line.

At least a portion of channel region 24 is horizontally-oriented for horizontal current flow in the portion between first source/drain region 20 and second source/drain region 22. In the depicted example embodiment, all of channel region 24 is horizontally-oriented for horizontal current flow there-through. Regardless, when suitable voltage is applied to gate 26, a conductive channel can form within channel region 24 proximate gate insulator material 28 such that current is capable of flowing between source/drain regions 20 and 22.

Capacitor 34 comprises a pair of electrodes, for example a first electrode 46 and a second electrode 48 (e.g., conductively-doped semiconductive material and/or metal material for each), having a capacitor insulator 50 there-between (e.g., silicon dioxide, silicon nitride, hafnium oxide, other high k insulator material and/or ferroelectric material). First electrode 46 is electrically coupled, in one embodiment directly electrically coupled, to first source/drain region 20 of transistor 25. Additionally, in one embodiment, first electrode 46 comprises an annulus 41 in a straight-line horizontal cross-section (e.g., the cross-section shown by FIG. 2). Capacitor insulator 50 is radially inward of first-electrode annulus 41, in one embodiment extends elevationally through vertically-alternating tiers 12 and 14, and regardless in one embodiment comprises an annulus 43 in a straight-line horizontal cross-section (e.g., the cross-section shown by FIG. 2). Second electrode 48 is radially inward of capacitor insulator 50, and in one embodiment as shown is not annular in any straight-line horizontal cross-section.

A capacitor-electrode structure 52 (e.g., a solid or hollow pillar, a solid or hollow wall, etc.) extends elevationally through vertically-alternating tiers 12 and 14, with individual second electrodes 48 of individual capacitors 34 that are in different memory-cell tiers 14 being electrically coupled, in one embodiment directly electrically coupled, to elevationally-extending capacitor-electrode structure 52. In one embodiment and as shown, second electrode 48 of individual capacitors 34 comprises a portion of elevationally-extending capacitor-electrode structure 52. In one embodiment and as shown, capacitor-electrode structure 52 is not annular in any straight-line horizontal cross-section, and in one embodiment extends vertically or within 10° of vertical. Example materials for capacitor-electrode structure 52 are metal materials and conductively-doped semiconductor materials. In one embodiment and as shown, capacitor-electrode structure 52 comprises a pillar 55, with capacitor insulator 50 being received circumferentially about structure 52/pillar 55. In one embodiment, such, by way of example only, is one example of how second capacitor electrodes 48 of multiple of capacitors 34 that are in different memory-cell tiers 14 in the array may be electrically coupled with one another. In one embodiment and as shown, capacitor-electrode structure 52 is directly electrically coupled to a horizontally-elongated capacitor-electrode structure 29 (e.g., a line or a plate) that is above or below (above being shown) vertically-alternating tiers 12 and 14. Construction(s) 29 may, in one embodiment, directly electrically couple together all second electrodes 48 within the array.

A sense line is electrically coupled, in one embodiment directly electrically coupled, to multiple of the second source/drain regions of individual of the transistors that are in different memory-cell tiers 14. In one embodiment and as shown, a sense-line structure 56 (e.g., a solid or hollow pillar, a solid or hollow wall, etc.) extends elevationally through vertically-alternating tiers 12 and 14, with individual second source/drain regions 22 of individual transistors 25 that are in different memory-cell tiers 14 being electrically coupled, in one embodiment directly electrically coupled, thereto. In one embodiment and as shown, sense-line structure 56 extends vertically or within 10° of vertical. In one embodiment and as shown, sense-line structure 56 comprises a pillar 59. In one embodiment and as shown, sense-line structure 56 comprises a peripheral conductively-doped semiconductive material 58 (e.g., polysilicon) and a central metal material core 60 (e.g., TiN and/or W). In one embodiment, sense-line structure 56 is directly electrically coupled to a horizontal longitudinally-elongated sense line 57 that is above or below (above being shown) vertically-alternating tiers 12 and 14. In the example embodiment, structure 29 and sense line 57 are both above tiers 12 and 14. This may be reversed, or one may above and the other below tiers 12 and 14

Some embodiments of the invention comprise a memory array (e.g., 10) comprising vertically-alternating tiers (e.g., 12, 14) of insulative material (e.g., 16) and memory cells (e.g., 19), respectively. The memory cells individually comprise a transistor (e.g., 25) and a capacitor (e.g., 34). The capacitor comprises a first electrode (e.g., 46) electrically coupled to a source/drain region (e.g., 20) of the transistor. The first electrode comprises an annulus (e.g., 41) in a straight-line horizontal cross-section (e.g., the cross-section shown by FIG. 2). A capacitor insulator (e.g., 50) is radially inward of the first electrode annulus. A second electrode (e.g., 48) is radially inward of the capacitor insulator. A capacitor-electrode structure (e.g., 52) extends elevationally through the vertically-alternating tiers. Individual of the second electrodes of individual of the capacitors are electrically coupled to the elevationally-extending capacitor-electrode structure. A sense line (e.g., 56) is electrically coupled to another source/drain region (e.g., 22) of multiple of the transistors that are in different memory-cell tiers.

The above example structures may be manufactured by any existing or yet-to-be-developed techniques. Further, embodiments of the invention encompass methods of forming a memory array comprising memory cells individually comprising a transistor and a capacitor. Such methods may have or use any of the structural attributes described and shown above with respect to the largely finished circuitry construction of FIGS. 1-3, or may not. Additionally, aspects of the invention include a memory array comprising vertically-alternating tiers of insulative material and memory cells as herein disclosed and described independent of method of manufacture. Regardless, one example technique of manufacturing the embodiment shown by FIGS. 1-3 and a method embodiment of the invention are described with reference to FIGS. 4-28. Like numerals from the above-described embodiments have been used for predecessor construction(s), regions, and like/predecessor materials thereof.

Referring to FIGS. 4-7, an example method comprises forming vertically-alternating tiers (e.g., 12, 14) of insulative material (e.g., 16) and transistors (e.g., 25), respectively. Tiers 14 of transistors 25 comprise horizontally-alternating active area lines 7 and insulating-material lines 9. Transistors 25 individually comprise first source/drain regions (e.g., 20) and second source/drain regions (e.g., 22) having a channel region (e.g., 24) there-between. A gate (e.g., 26) is operatively proximate the channel region. The gate comprises a portion of a horizontal longitudinally-elongated access line (e.g., 27) that interconnects multiple of the gates along that access line. Individual active-area lines 7 comprise the first source/drain region, the second source/drain region, and the channel region.

Figure 4:
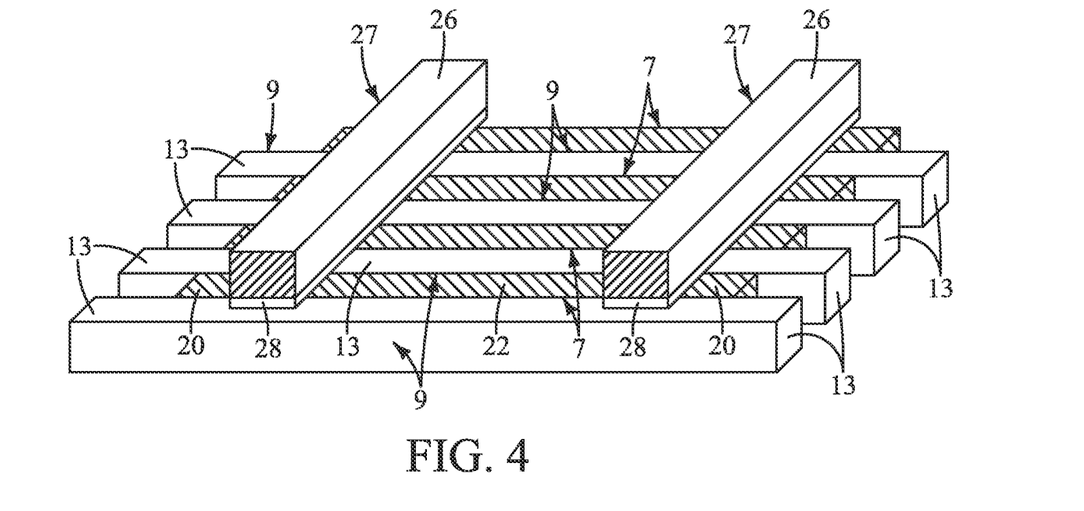
FIG. 4 is a diagrammatic perspective view of a predecessor substrate to that shown by FIGS. 1-3.
Figure 5:
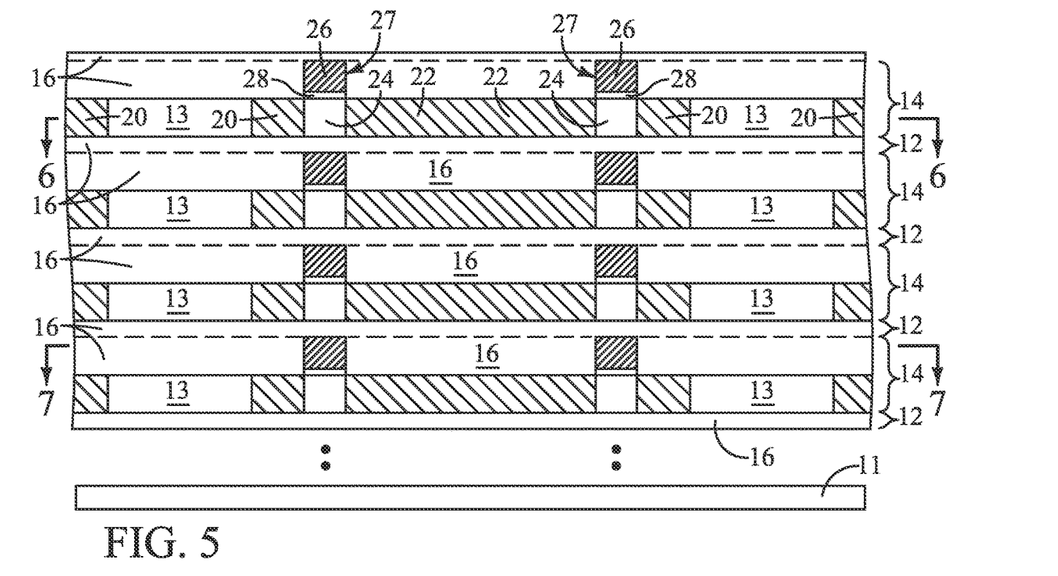
FIG. 5 is a sectional view of the FIG. 4 substrate at a processing step subsequent to that shown by FIG. 4.
Figure 6:
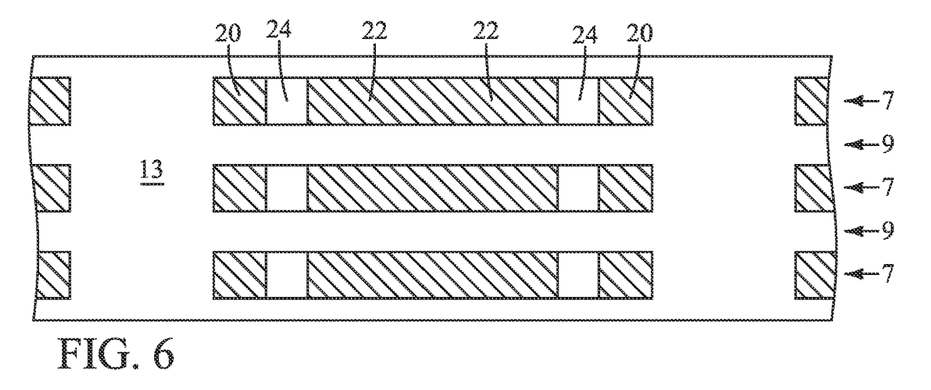
FIG. 6 is a sectional view taken through line 6-6 in FIG. 5.
Figure 7:
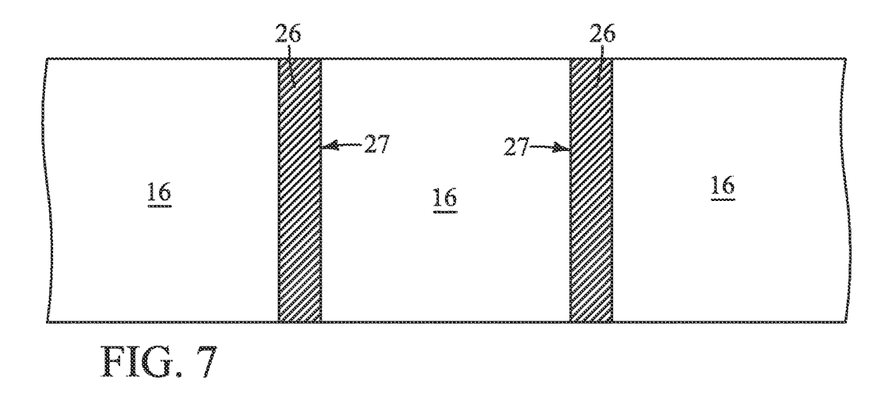
FIG. 7 is a sectional view taken through line 7-7 in FIG. 5.

FIG. 4 shows a single transistor tier 14 absent insulative material 16 for clarity. In one embodiment, masking steps (e.g., photolithography and/or e-beam lithography, followed by sacrificial etching) are used to pattern individual transistor tiers 14 before forming insulative material 16 of the insulative material tier 12 that is immediately-vertically thereover. Pitch multiplication may be used. Regardless, in one embodiment the number of masking steps used per fabrication of individual transistor tiers 14 totals two, and only two, for each transistor tier 14. Specifically, one masking step would be used for forming active-area lines 7 and insulating-material lines 9. Such, by way of example, may include using one masking step in which semiconductor material is subtractively patterned to leave active-area lines 7, followed by deposition and planarizing back of insulating material 13 there-between, which thereby forms insulating-material lines 9 in a self-aligned manner. The other masking step would then be used for formation of access lines 27 (e.g., subtractively, and regardless of whether gate insulator 28 is also patterned when patterning access lines 27). Suitable doping of one or more of regions 20, 22, and 24 may have occurred previously, may occur at this point in the method, or may occur subsequently.

Capacitors are formed that individually comprise first and second electrodes having a capacitor insulator there-between. The first electrode is electrically coupled, in one embodiment directly electrically coupled, to individual of the first source/drain regions of individual of the transistors. The second capacitor electrodes of multiple of the capacitors in the array are electrically coupled, in one embodiment directly electrically coupled, with one another. One example such embodiment is described with reference to FIGS. 8-25.

Figure 8:
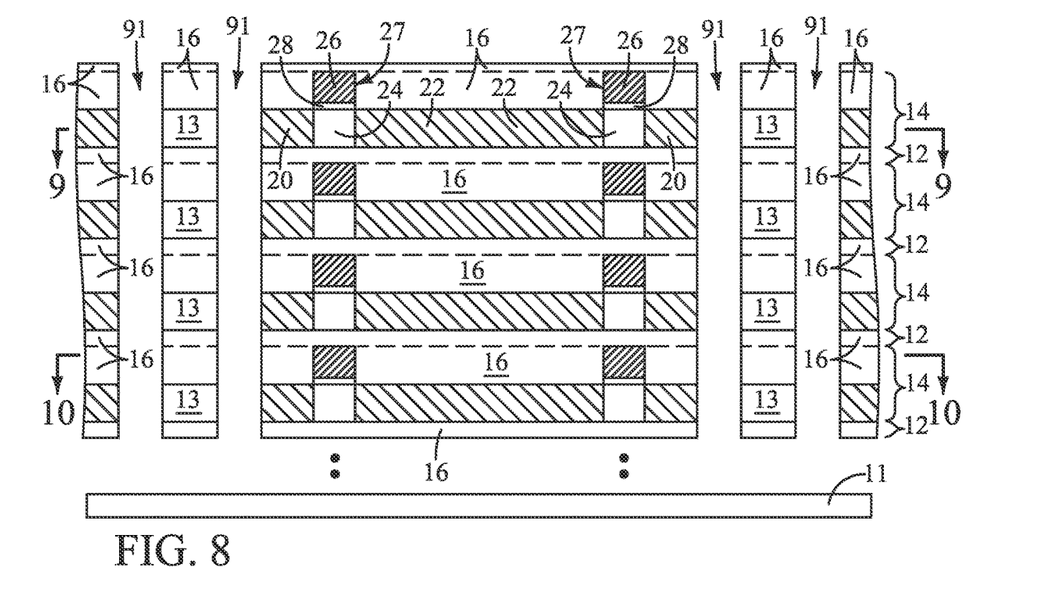
FIG. 8 is a sectional view of the FIG. 5 substrate at a processing step subsequent to that shown by FIG. 5.
Figure 9:
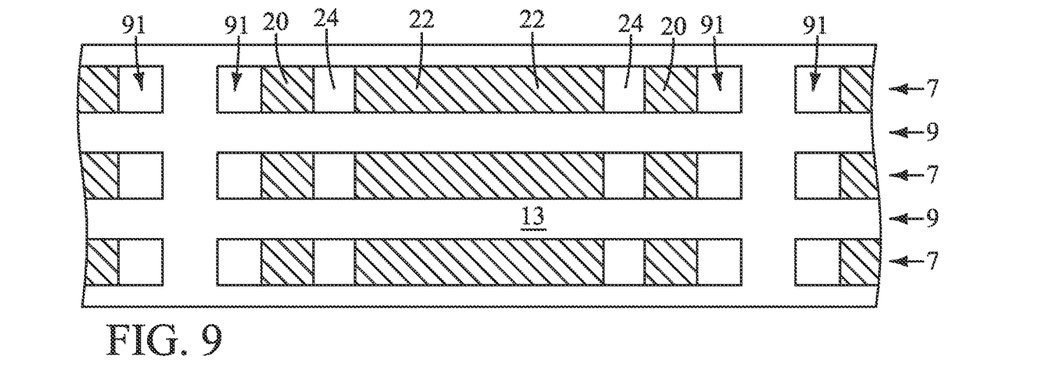
FIG. 9 is a sectional view taken through line 9-9 in FIG. 8.
Figure 10:
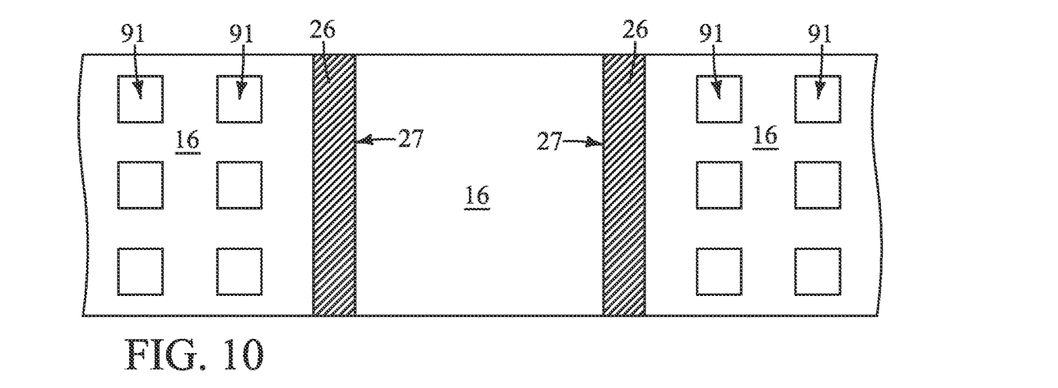
FIG. 10 is a sectional view taken through line 10-10 in FIG. 8.

Referring to FIGS. 8-10, openings 91 have been formed to extend elevationally through multiple of tiers 12 and 14 as shown. As an example, such may be formed using a suitable masking step, and with or without pitch multiplication. While multiple openings 91 are shown, the discussion largely proceeds relative to fabrication associated with respect to a single opening 91. Regardless, in one embodiment and as shown, opening 91 is formed after forming access lines 27.

Figure 11:
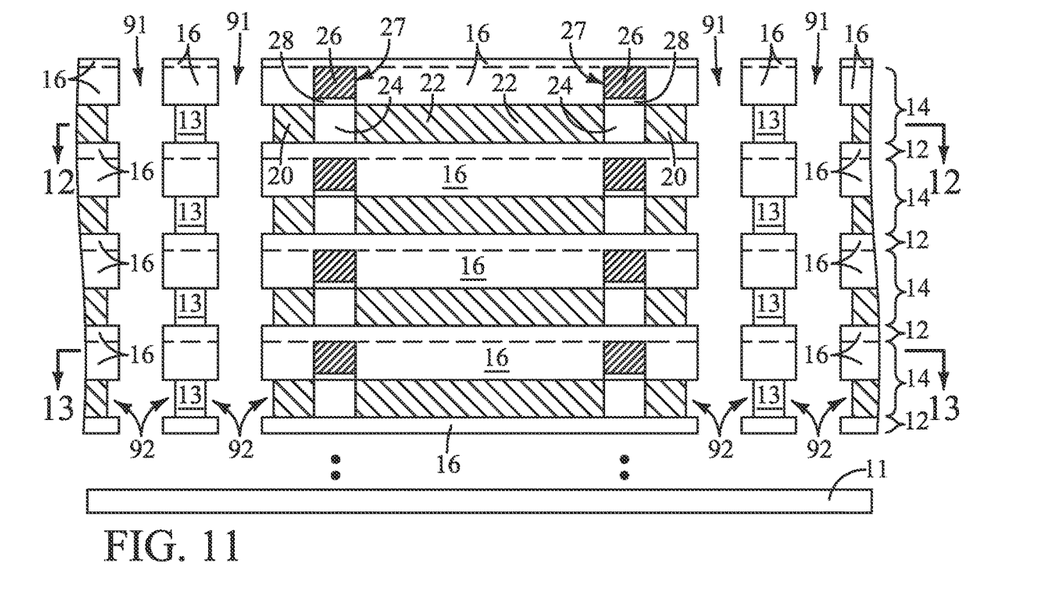
FIG. 11 is a sectional view of the FIG. 8 substrate at a processing step subsequent to that shown by FIG. 8.
Figure 12:
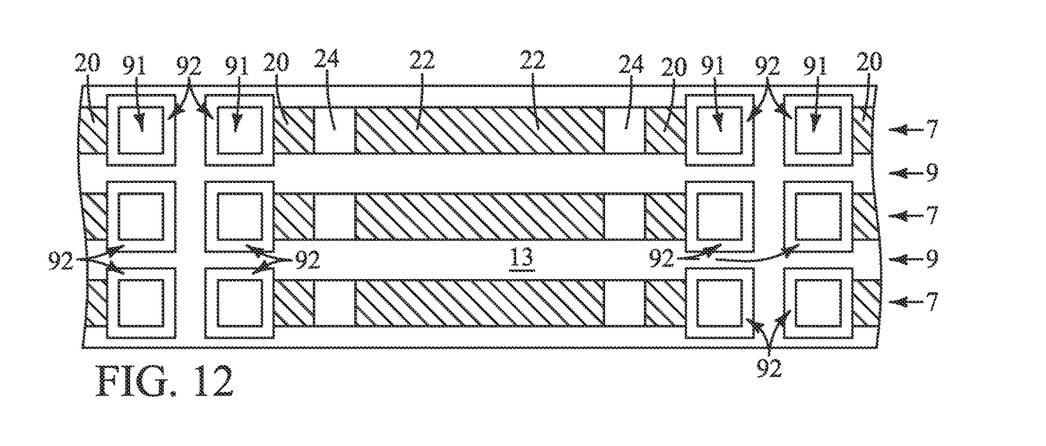
FIG. 12 is a sectional view taken through line 12-12 in FIG. 11.
Figure 13:
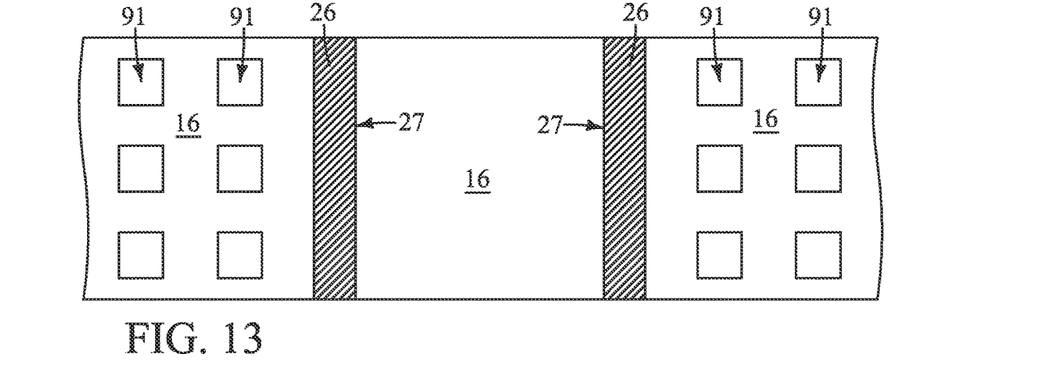
FIG. 13 is a sectional view taken through line 13-13 in FIG. 11.

Referring to FIGS. 11-13, and in one embodiment, within opening 91, insulating material 13 and material of regions 20 of transistor tiers 14 have been etched selectively relative to insulative material 16 of insulative tiers 12 to widen and/or radially expand openings 91 and form annular void spaces 92 in transistor tiers 14. Individual annular void spaces 92 extend radially to individual first source/drain regions 20. Such may be conducted in a single or more than one etching step. An example etching chemistry that may be used where insulating material 13 is silicon dioxide is dilute HF and where material of region 20 comprises elemental-form silicon is tetramethyl-ammonium hydroxide.

Figure 14:
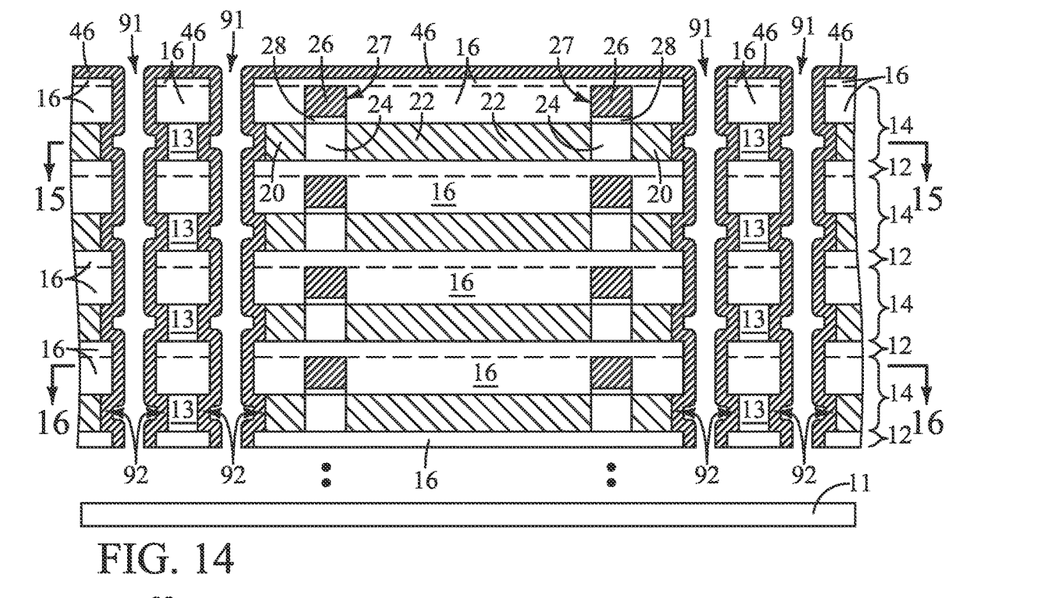
FIG. 14 is a sectional view of the FIG. 11 substrate at a processing step subsequent to that shown by FIG. 11.
Figure 15:
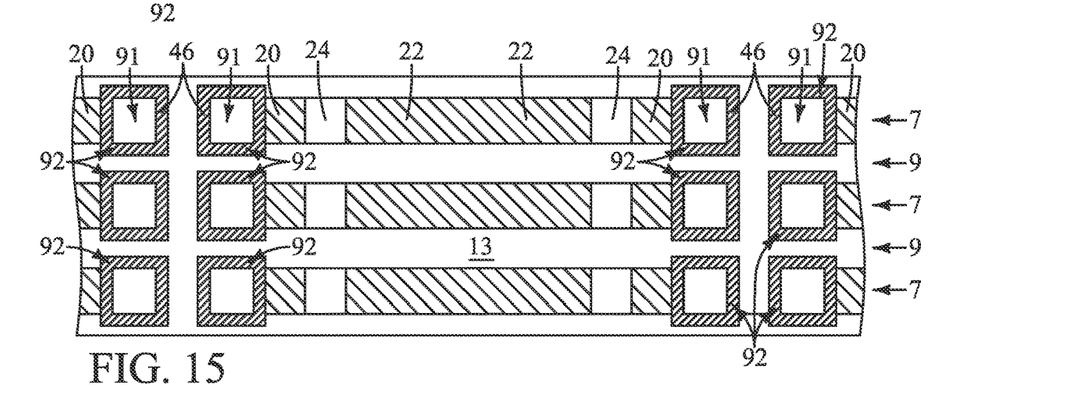
FIG. 15 is a sectional view taken through line 15-15 in FIG. 14.
Figure 16:
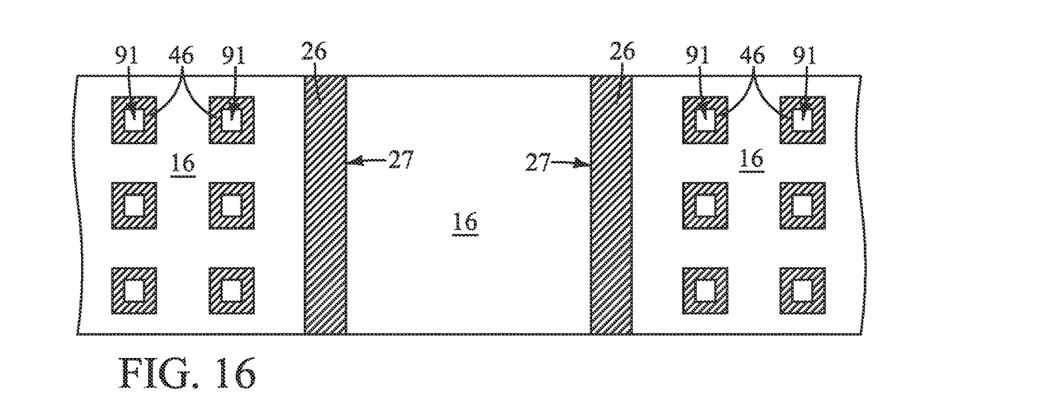
FIG. 16 is a sectional view taken through line 16-16 in FIG. 14.

Referring to FIGS. 14-16, conductive material 46 (e.g., metal material, such as TiN) has been formed in opening 91 along sidewalls of such opening and in annular void spaces 92, for example to fill and essentially overfill such void spaces as shown.

Figure 17:
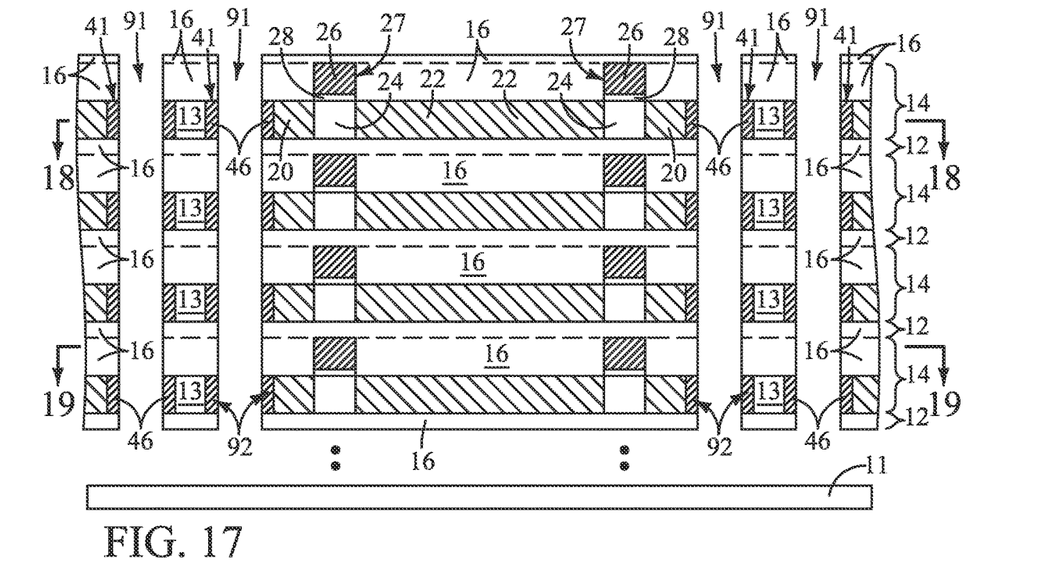
FIG. 17 is a sectional view of the FIG. 14 substrate at a processing step subsequent to that shown by FIG. 14.
Figure 18:
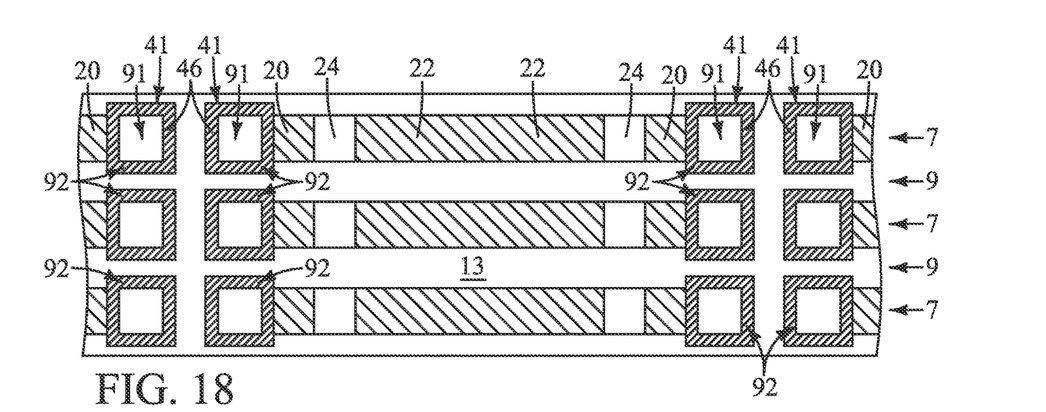
FIG. 18 is a sectional view taken through line 18-18 in FIG. 17.
Figure 19:
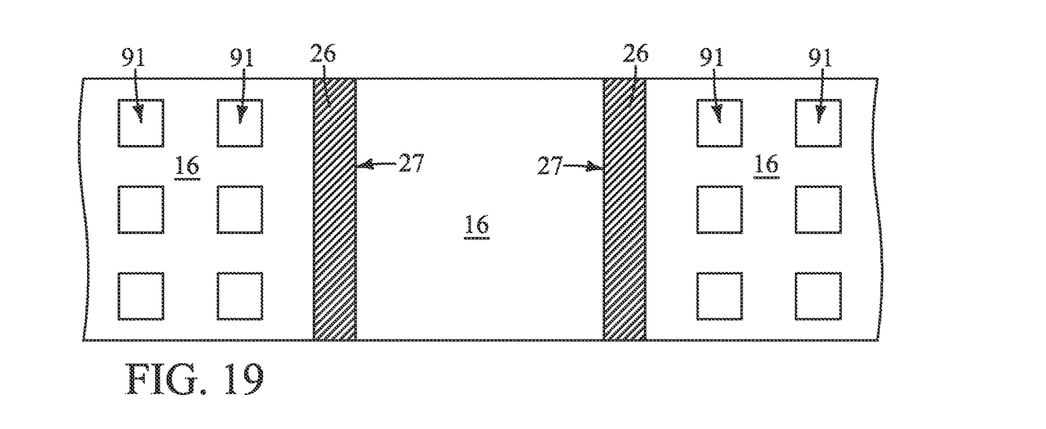
FIG. 19 is a sectional view taken through line 19-19 in FIG. 17.

Referring to FIGS. 17-19, conductive material 46 has been removed from the sidewalls of opening 91 to leave conductive material 46 in annular void spaces 92 to form individual annular first electrodes 46 (e.g., individually comprising an annulus 41). Such may be conducted, for example, by a suitable dry anisotropic etch or by a timed wet etch of conductive material 46 selectively relative to other exposed materials. Such comprises but one example of, within opening 91, forming a first electrode 46 electrically coupled, in one embodiment directly electrically coupled, to first source/drain region 20 of individual transistors 25, and wherein first electrode 46 comprises an annulus 41 within widened opening 91 in individual transistor tiers 14.

Figure 20:
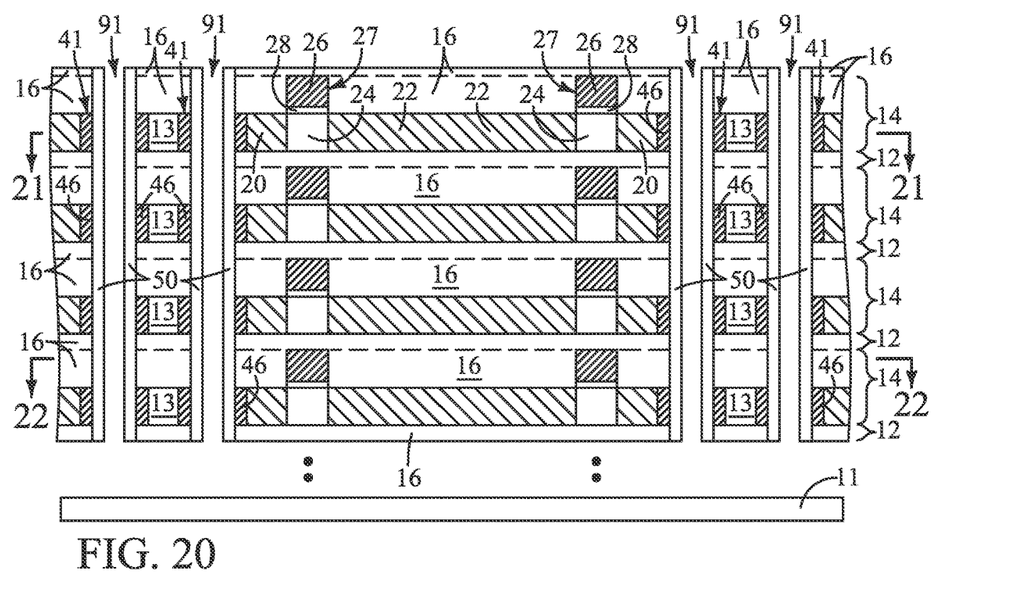
FIG. 20 is a sectional view of the FIG. 17 substrate at a processing step subsequent to that shown by FIG. 17.
Figure 21:
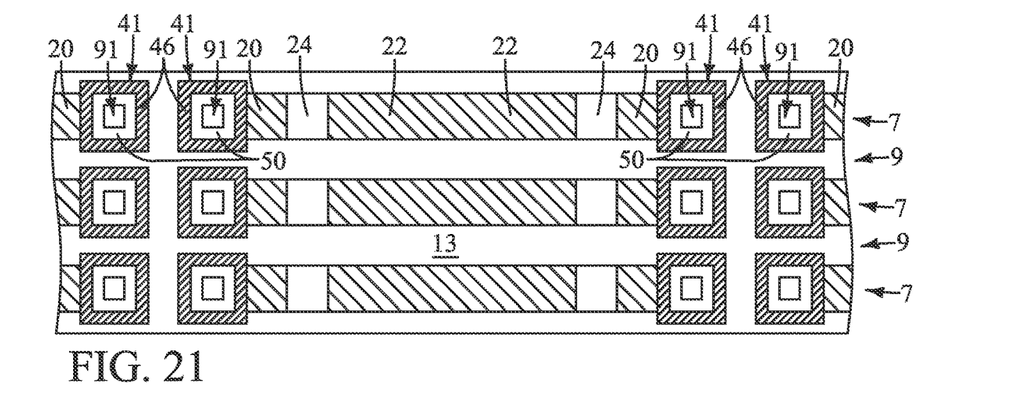
FIG. 21 is a sectional view taken through line 21-21 in FIG. 20.
Figure 22:
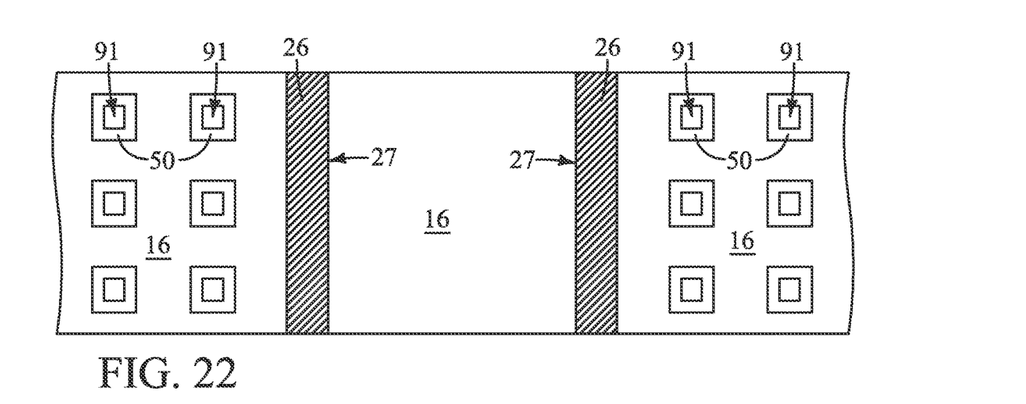
FIG. 22 is a sectional view taken through line 22-22 in FIG. 20.
Figure 23:
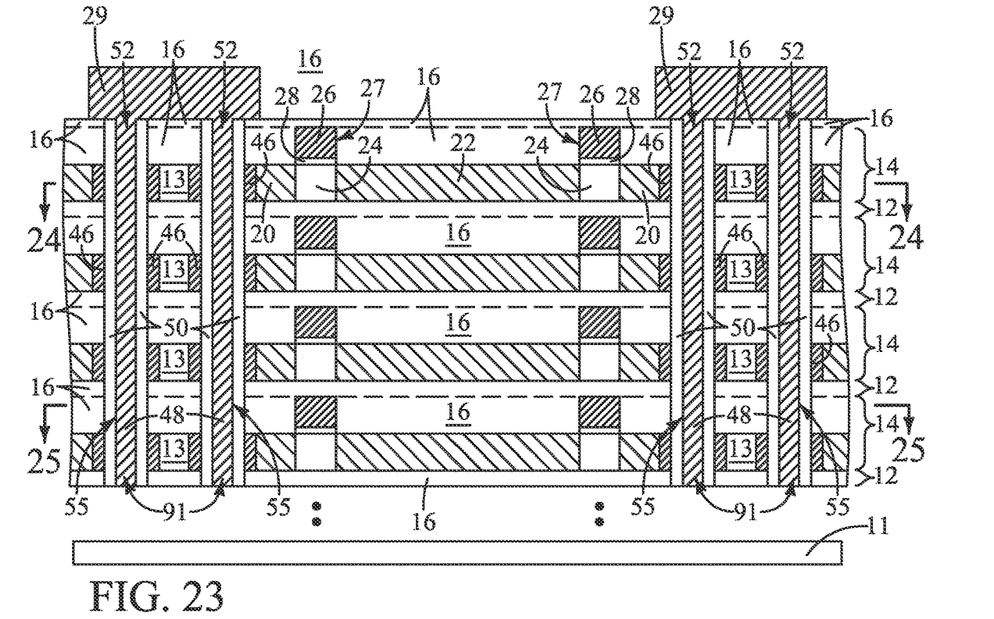
FIG. 23 is a sectional view of the FIG. 20 substrate at a processing step subsequent to that shown by FIG. 20.
Figure 24:
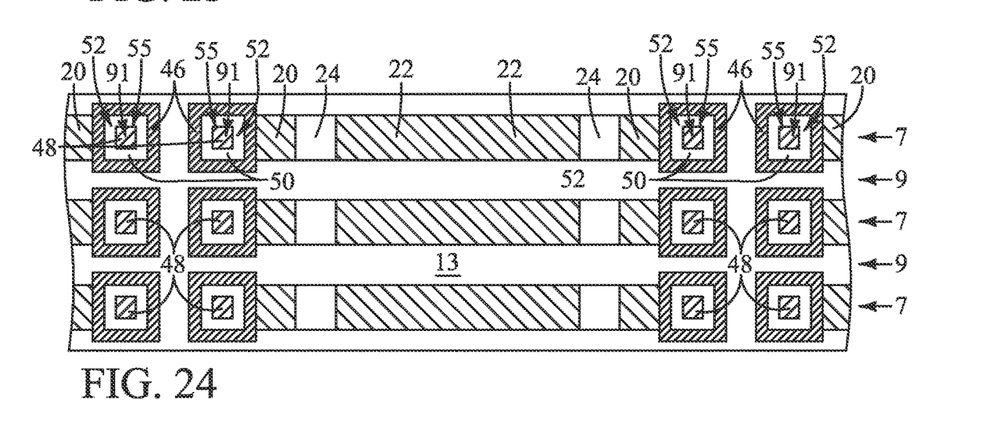
FIG. 24 is a sectional view taken through line 24-24 in FIG. 23.
Figure 25:
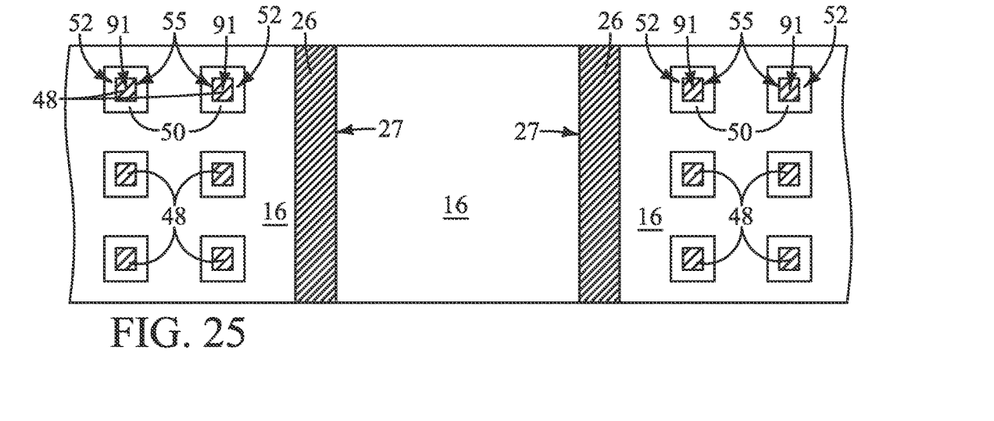
FIG. 25 is a sectional view taken through line 25-25 in FIG. 23.

Referring to FIGS. 20-22, a capacitor insulator (e.g., 50) is formed within opening 91 radially inward of first electrode annulus 41. In one embodiment and as shown, the capacitor insulator is formed to extend elevationally through vertically-alternating tiers 12 and 14.

In one embodiment, a capacitor-electrode structure (e.g., 52 in FIGS. 23-25) is formed within opening 91 radially inward of capacitor insulator 50, and to extend elevationally through multiple vertically-alternating tiers 12 and 14. Elevationally-extending capacitor-electrode structure 52 comprises a second electrode 48 of individual capacitors 34. In one embodiment and as shown, capacitor-electrode structure 52 is directly electrically coupled to a horizontally-elongated capacitor-electrode structure (e.g., 29 as a line or a plate) that is formed above or below (above being shown) vertically-alternating tiers 12 and 14.

Figure 26:
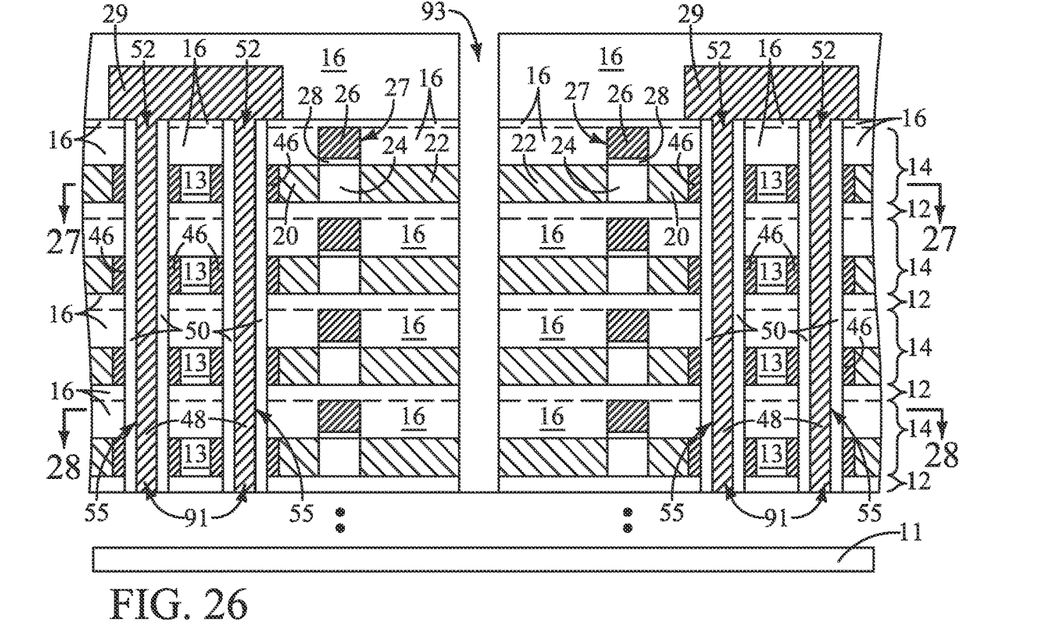
FIG. 26 is a sectional view of the FIG. 23 substrate at a processing step subsequent to that shown by FIG. 23.
Figure 27:
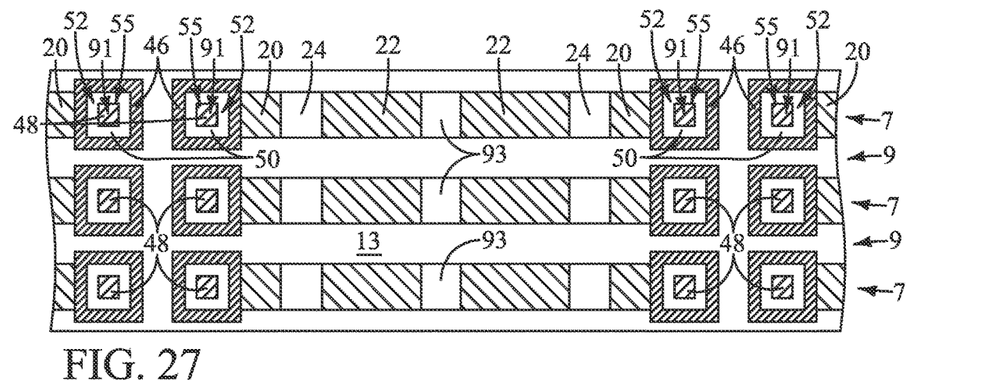
FIG. 27 is a sectional view taken through line 27-27 in FIG. 26.
Figure 28:
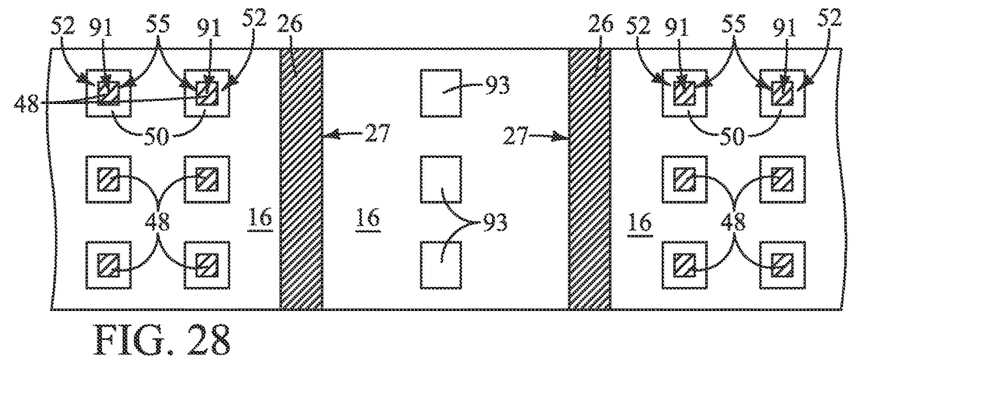
FIG. 28 is a sectional view taken through line 28-28 in FIG. 26.

A sense line is formed that is electrically coupled, in one embodiment directly electrically coupled, to multiple of the second source/drain regions of the individual transistor that are in different memory-cell tiers. In one embodiment, a sense-line structure (e.g., 56) is formed to extend elevationally through the vertically-alternating tiers. Individual of the second source/drain regions of individual transistors that are in different memory-cell tiers are electrically coupled, in one embodiment directly electrically coupled, to the elevationally-extending sense-line structure. For example, FIGS. 26-28 show deposition of more insulative material 16 and formation of openings 93 through alternating tiers 12 and 14, including through second source/drain regions 22. Subsequent processing may be conducted to produce, for example, the structure of FIG. 1 to include sense-line structure 56 and a horizontally longitudinally-elongated sense line 57 that is above vertically-alternating tiers 12 and 14 and above horizontally-elongated capacitor-electrode construction 29.

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, a selective etch or removal is an etch or removal where one material is removed relative to another stated material or materials at a rate of at least 2.0:1. Further, selectively growing or selectively forming is growing or forming one material relative to another stated material or materials at a rate of at least 2.0:1 for at least the first 100 Angstroms of growing or forming.

Further, a "self-aligned manner" means a technique whereby at least a lateral surface of a structure is defined by deposition of material against a sidewall of a previously-patterned structure.

CONCLUSION

In some embodiments, a memory array comprises vertically-alternating tiers of insulative material and memory cells. The memory cells individually comprise a transistor and a capacitor. The capacitor comprises a first electrode electrically coupled to a source/drain region of the transistor. The first electrode comprises an annulus in a straight-line horizontal cross-section and a capacitor insulator radially inward of the first electrode annulus. A second electrode is radially inward of the capacitor insulator. A capacitor-electrode structure extends elevationally through the vertically-alternating tiers. Individual of the second electrodes of individual of the capacitors are electrically coupled to the elevationally-extending capacitor-electrode structure. A sense line is electrically coupled to another source/drain region of multiple of the transistors that are in different memory-cell tiers.

In some embodiments, a memory array comprises vertically-alternating tiers of insulative material and memory cells. The memory cells individually comprise a transistor comprising first and second source/drain regions having a channel region there-between and a gate operatively proximate the channel region. At least a portion of the channel region is horizontally-oriented for horizontal current flow in the portion between the first and second source/drain regions. The memory cells individually include a capacitor comprising a first electrode electrically coupled to the first source/drain region of the transistor. The first electrode comprises an annulus in a straight-line horizontal cross-section. A capacitor insulator is radially inward of the first electrode annulus. A second electrode is radially inward of the capacitor insulator. A capacitor-electrode structure extends elevationally through the vertically-alternating tiers. The second electrode of individual of the capacitors comprises a portion of the elevationally-extending capacitor-electrode structure. A sense-line structure extends elevationally through the vertically-alternating tiers. Individual of the second source/drain regions of individual of the transistors that are in different memory-cell tiers are electrically coupled to the elevationally-extending sense-line structure.

In some embodiments, a method of forming a memory array comprising memory cells individually comprising a transistor and a capacitor includes forming vertically-alternating tiers of insulative material and transistors. The tiers of transistors comprise horizontally-alternating lines of active area and insulating material. The transistors individually comprise first and second source/drain regions having a channel region there-between and a gate operatively proximate the channel region. The gate comprises a portion of a horizontal longitudinally-elongated access line that interconnects multiple of the gates along that access line. Individual of the active-area lines comprise the first source/drain region, the second source/drain region, and the channel region. Capacitors are formed that individually comprise first and second electrodes having a capacitor insulator there-between. The first electrode is electrically coupled to individual of the first source/drain regions of individual of the transistors. The second capacitor electrodes of multiple of the capacitors in the array are electrically coupled with one another. A sense-line structure is formed that extends elevationally through the vertically-alternating tiers. Individual of the second source/drain regions of the individual transistors that are in different transistor tiers are electrically coupled to the elevationally-extending sense-line structure.

In some embodiments, a method of forming a memory array comprising memory cells individually comprising a transistor and a capacitor includes forming vertically-alternating tiers of insulative material and transistors. The tiers of transistors comprise horizontally-alternating lines of active area and insulating material. The transistors individually comprise first and second source/drain regions having a channel region there-between and a gate operatively proximate the channel region. The gate comprises a portion of a horizontal longitudinally-elongated access line that interconnects multiple of the gates along that access line. Individual of the active-area lines comprise the first source/drain region, the second source/drain region, and the channel region. Capacitors of individual memory cells are formed and comprises forming an opening extending elevationally through multiple of the tiers. Within the opening, a first electrode is formed that is electrically coupled to the first source/drain region of individual of the transistors. The first electrode comprises an annulus within the opening. A capacitor insulator is formed within the opening radially inward of the first electrode annulus. A capacitor-electrode structure is formed within the opening radially inward of the capacitor insulator and extends elevationally through the multiple vertically-alternating tiers. The elevationally-extending capacitor-electrode structure comprises a second electrode of individual of the capacitors. A sense line is formed that is electrically coupled to multiple of the second source/drain regions of the individual transistors that are in different transistor tiers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising vertically alternating tiers of insulative material and memory cells, the memory cells individually comprising a transistor and a capacitor disposed horizontally relative to each other within the tiers of memory cells, the capacitor comprising:
    an outer electrode electrically coupled to a source/drain region of the transistor, the outer electrode comprising metal and being disposed at an elevation over a substrate equivalent to an elevation over the substrate of a channel region of the transistor, the outer electrode comprising an annulus in a straight-line horizontal cross-section, the annulus having an upper surface at a common elevation with an upper surface of the source/drain region and having a lower surface at a common elevation with a lower surface of the source/drain region; an inner electrode radially inward of the outer electrode; and
    a capacitor-electrode structure extending elevationally through multiple of the vertically alternating tiers, the inner electrode of a plurality of the capacitors being electrically coupled to the elevationally extending capacitor-electrode structure.

2. The array of claim 1 further comprising a sense line electrically coupled to another source/drain region of multiple transistors that are in different memory-cell tiers.

3. The array of claim 2 wherein the sense line comprises a sense line structure extending elevationally through the vertically alternating tiers, individual of the another source/drain regions of individual transistors that are in different memory cell tiers being electrically coupled to the elevationally extending sense line structure.

4. The array of claim 1 wherein the capacitor-electrode structure comprises a pillar.

5. The array of claim 1 further comprising a capacitor insulator extending elevationally through the vertically alternating tiers.

6. The array of claim 4 wherein the capacitor insulator comprises an annulus in a straight-line horizontal cross-section.

7. The array of claim 1 wherein the inner electrode is not annular.

8. The array of claim 1 wherein the capacitor electrode structure is directly electrically coupled to a horizontally elongated capacitor electrode construction that is above or below the vertically alternating tiers.

9. A memory array, comprising:
    vertically alternating tiers of insulative material and memory cells, the memory cells individually comprising:
        a transistor comprising a first source/drain region, a second source/drain region, a channel region between the first source/drain region and the second source/drain region, and a gate operatively proximate the channel region, at least a portion of the channel region being horizontally oriented for horizontal current flow in the at least a portion between the first source/drain region and the second source/drain region;
        a capacitor disposed horizontally relative to the transistor, the capacitor comprising:
            a first electrode electrically coupled to the first source/drain region of the transistor, the first electrode comprising metal and having an upper surface at an elevation over a substrate equivalent to an elevation over the substrate a surface extending across the channel region and the first source/drain region, the first electrode comprising an annulus in a straight-line horizontal cross-section;
            a capacitor insulator radially inward of the first electrode annulus; and
            a second electrode radially inward of the capacitor insulator;
        a capacitor-electrode structure extending elevationally through the vertically alternating tiers, the second electrode of individual capacitors comprising a portion of the capacitor electrode structure.

10. The array of claim 9 further comprising a sense-line structure extending elevationally through the vertically alternating tiers, individual of the second source/drain regions of individual transistors that are in different memory cell tiers being electrically coupled to the elevationally extending sense line structure.

11. The array of claim 9 wherein all the channel region is horizontally oriented for horizontal current flow therethrough.

12. The array of claim 9 wherein the first electrode is directly electrically coupled to the first source/drain region.

13. The array of claim 9 wherein the capacitor electrode structure is directly electrically coupled to a horizontally elongated capacitor electrode construction that is above or below the vertically alternating tiers.

14. A memory array, comprising:
    vertically alternating tiers of insulative material and transistors, the tiers of transistors comprising horizontally alternating lines of active area and insulating material, the transistors individually comprising:
        a first source/drain region and a second source/drain region having a channel region there-between and a gate operatively proximate the channel region, the gate comprising a portion of a horizontal longitudinally elongated access line that interconnects multiple of the gates along that access line; individual of the active-area lines comprising the first source/drain region, the second source/drain region, and the channel region;

capacitors individually comprising a first electrode and a second electrode having a capacitor insulator therebetween, the capacitor insulator extending continuously through multiple of the vertically alternating tiers, the first electrode being present only within a single of the tiers of transistors and being disposed at an elevation equivalent to an elevation of the channel region of the transistor, the first electrode comprising metal and being electrically coupled to individual of the first source/drain regions of individual transistors, the second capacitor electrode of multiple of the capacitors in the array being electrically coupled with one another; and a sense line structure extending elevationally through the vertically alternating tiers, the second source/drain region of individual transistors that are in different transistor tiers being electrically coupled to the elevationally extending sense-line structure.

15. The memory array of claim 14 wherein the first electrode is an annulus.

16. The memory array of claim 14 wherein the sense line structure comprises a pillar.

17. The memory array of claim 14 wherein the second capacitor electrode of multiple of the capacitors in the array are electrically coupled with one another through a pillar structure.

18. The memory array of claim 14 wherein the capacitor insulator comprises an annulus in a straight-line horizontal cross-section.

* * * * *